(12) United States Patent
Yang et al.

(10) Patent No.: US 10,109,657 B2
(45) Date of Patent: Oct. 23, 2018

(54) DISPLAY DEVICE

(71) Applicant: LG Display Co., Ltd., Seoul (KR)

(72) Inventors: Seungyong Yang, Gyeonggi-do (KR); Jinil Song, Gyeonggi-do (KR); Yongmin Choi, Chugcheongbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/607,979

(22) Filed: May 30, 2017

(65) Prior Publication Data

US 2017/0345846 A1 Nov. 30, 2017

(30) Foreign Application Priority Data

May 31, 2016 (KR) ........................ 10-2016-0067780

(51) Int. Cl.
*H01L 27/14* (2006.01)
*H01L 29/04* (2006.01)
*H01L 29/15* (2006.01)
*H01L 31/036* (2006.01)
(Continued)

(52) U.S. Cl.
CPC ...... *H01L 27/1244* (2013.01); *H01L 27/1248* (2013.01); *H01L 27/1255* (2013.01); *H01L 27/3248* (2013.01); *H01L 27/3262* (2013.01); *H01L 27/3272* (2013.01)

(58) Field of Classification Search
USPC ............... 257/81, 82, 91, 98–100, 116, 117, 257/432–437, 749, E33.056–E33.059, 257/E25.032, 57, 59, 72, 83, 257, 290, 257/351, 368, 392, 223, 227, 291, 292, 257/439, 443, 655, E27.1, E27.125, 257/E27.122, E29.117, E29.145, E29.147, 257/E29.151, E29.182, E29.202, 257/E29.273–E29.299, E29.314, E29.32, 257/E23.016; 438/25–28, 30, 48, 128, 438/149, 151, 157, 161, 283, 163
See application file for complete search history.

(56) References Cited

U.S. PATENT DOCUMENTS 9,129,923 B1 9/2015 Han et al.
2006/0102905 A1 5/2006 Park
(Continued)

FOREIGN PATENT DOCUMENTS

KR 10-2017-0005925 A 1/2017

OTHER PUBLICATIONS

Extended European Search Report dated Sep. 27, 2017, for corresponding European Patent Application No. 17173664.8.

*Primary Examiner* — Tram H Nguyen
(74) *Attorney, Agent, or Firm* — Morgan, Lewis & Bockius LLP

(57) ABSTRACT

A display device may include a light shield layer on a first substrate; a buffer layer on the light shield layer; a semiconductor layer on the buffer layer; a first insulating layer on the semiconductor layer; a gate metal layer on the first insulating layer; a second insulating layer having a contact hole on the gate metal layer and exposing a portion of the gate metal layer; and a source drain metal layer on the second insulating layer and in contact with the gate metal layer through the contact hole, wherein the semiconductor layer includes an auxiliary contact hole located in an area corresponding to the contact hole.

9 Claims, 13 Drawing Sheets

(51) Int. Cl.
  *H01L 27/12*  (2006.01)
  *H01L 27/32*  (2006.01)

(56) References Cited

U.S. PATENT DOCUMENTS

| | | |
|---|---|---|
| 2015/0144905 A1* | 5/2015 | Kim .................... H01L 29/7831 |
| | | 257/40 |
| 2016/0064421 A1 | 3/2016 | Oh et al. |
| 2016/0064673 A1 | 3/2016 | Park et al. |

* cited by examiner (a)

ACT-SD Short (b)

(a)

(b) (Non-Occurrence of short)

(a)

(b)

(a)

(b)

DISPLAY DEVICE

This application claims the benefit of Korean Patent Application No. 10-2016-0067780, filed on May 31, 2016, which is incorporated herein by reference for all purposes as if fully set forth herein.

BACKGROUND OF THE INVENTION

Field of the Invention

The present invention relates to a display device

Related Art

With advancement of information technologies, the demands for display devices which displays an image are increasing. A display device has been dramatically changed to replace a large cathode ray tube (CRT), and a thin and light display device having a large screen is widely used these days.

The display devices include a liquid crystal display device (LCD), a plasma display panel (PDP), an organic light emitting display device (OLED), and an electrophoretic display device (ED).

Each of the LCD, the OLED, and the ED includes a thin film transistor (TFT) substrate within an area in which subpixels are arranged in matrix. A TFT formed in the TFT substrate is formed by a process for depositing multiple metal layers and multiple insulating layers. The TFT substrate is implemented as a display panel.

A display device includes a display panel and a driving unit configured to drive the display panel. The driving unit includes a scan driver configured to supply a scan signal (or a gate signal) to the display panel, and a data driver configured to supply a data signal to the display panel. If a scan signal and a data signal are supplied to subpixels, the display device emits light through a selected subpixel, thereby enabled to display an image.

Recently, a display panel is implemented with a large screen and high resolution. Accordingly, even the number of metal layers and insulating layers formed on a thin film transistor substrate of a display panel is increasing. In addition, it increases complexity of the layout of the thin film transistor substrate and a probability of occurrence of an unintended short defect between metal layers positioned on different layers, which is caused due to over-etching and tearing of a layer by a foreign material. Thus, there is need for addressing these problems.

SUMMARY OF THE INVENTION

Accordingly, embodiments of the present disclosure are directed to a display device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a light shield layer disposed on a first substrate; a buffer layer disposed on the light shield layer; a semiconductor layer disposed on the buffer layer; a first insulating layer disposed on the semiconductor layer; a gate metal layer disposed on the first insulating layer; a second insulating layer having a contact hole disposed on the gate metal layer and exposing a portion of the gate metal layer; and a source drain metal layer disposed on the second insulating layer and in contact with the gate metal layer through the contact hole, wherein the semiconductor layer comprises an auxiliary contact hole located in an area corresponding to the contact hole.

In another aspect, a display device comprises a light shield layer disposed on a first substrate; a buffer layer disposed on the light shield layer; a semiconductor layer disposed on the buffer layer; a first insulating layer disposed on the semiconductor layer; a gate metal layer disposed on the first insulating layer; a second insulating layer having a contact hole disposed on the gate metal layer and exposing a portion of the gate metal layer; and a source drain metal layer disposed on the second insulating layer and contacting the gate metal layer through the contact hole, wherein the light shield layer comprises an auxiliary contact hole located in an area corresponding to the contact hole.

In yet another aspect, a display device comprises subpixels each disposed on a first substrate and having an emitting area and a circuit area, wherein the subpixels comprises: a contact hole formed in the circuit area and exposing a portion of a lower layer to help electrical connection between a signal line and a power line; and an auxiliary contact hole provided below the contact hole and located in an area corresponding to the contact hole.

It is to be understood that both the foregoing general description and the following detailed description are exemplary and explanatory and are intended to provide further explanation of the inventive concepts as claimed.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DESCRIPTION OF EXEMPLARY EMBODIMENTS

Reference will now be made in detail embodiments of the invention examples of which are illustrated in the accompanying drawings.

Hereinafter, the detailed embodiments of the invention will be described with reference to the accompanying drawings.

A display device according to the present invention is implemented as a TV, a video player, a personal computer (PC), a home theater, a smart phone, and the like. A display panel of the display device may be implemented as one selected from among a liquid display panel, an organic light emitting display panel, an electrophoretic display, a plasma display, and the like, but aspects of the present invention are not limited thereto.

In the following description, an organic light emitting display device which is based on an organic light emitting display panel is taken as an example of a display for convenience of explanation. In addition, the following description is provided about an exemplary case in which the display panel is implemented based on an oxide Thin Film Transistor (TFT). Through a process of metalizing part of a conducting layer of the oxide TFT is used, part of the oxide TFT is used as a conductor and the rest part thereof is used as a semiconductor.

In the following description, TFTs may be referred to as a source electrode and a drain electrode or a drain electrode and a source electrode, except a gate electrode, according to a type of the TFT, so, in order to avoid this limitation, they are indicated as a first electrode and a second electrode.

Figure 1:
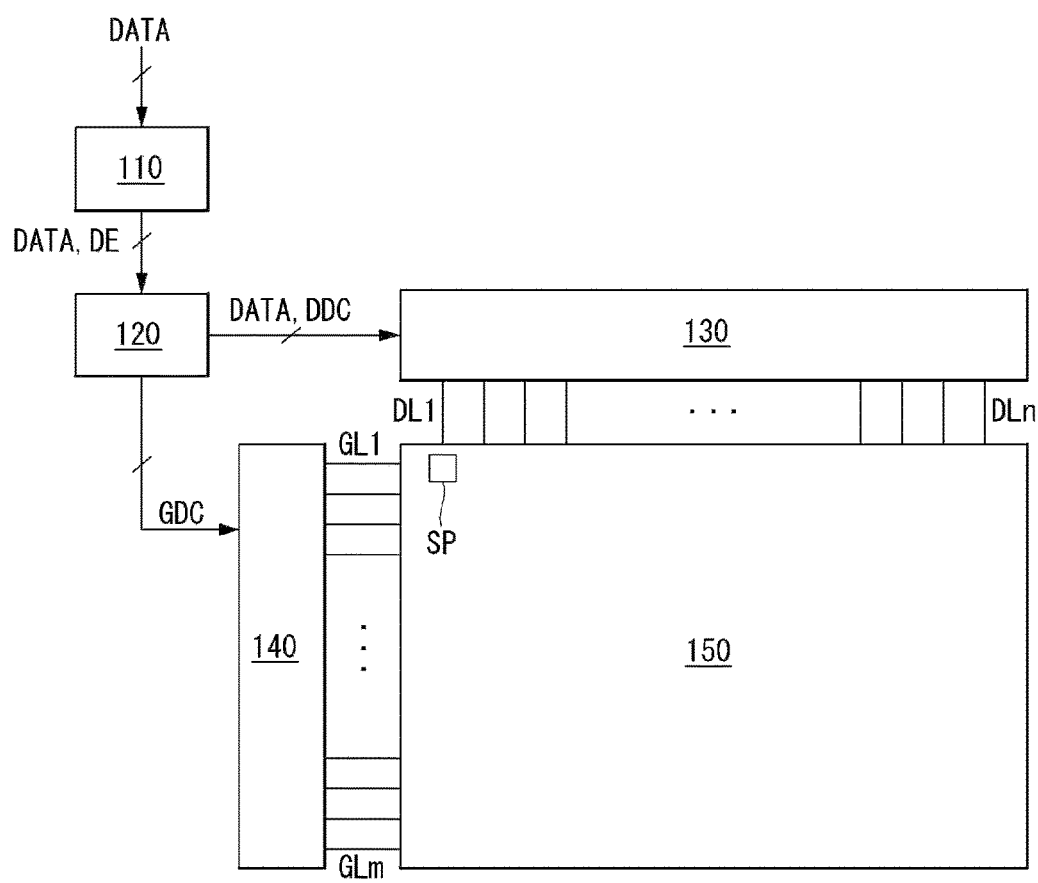
FIG. 1 is a schematic block diagram illustrating an organic light emitting display device according to an embodiment of the present invention.
Figure 2:
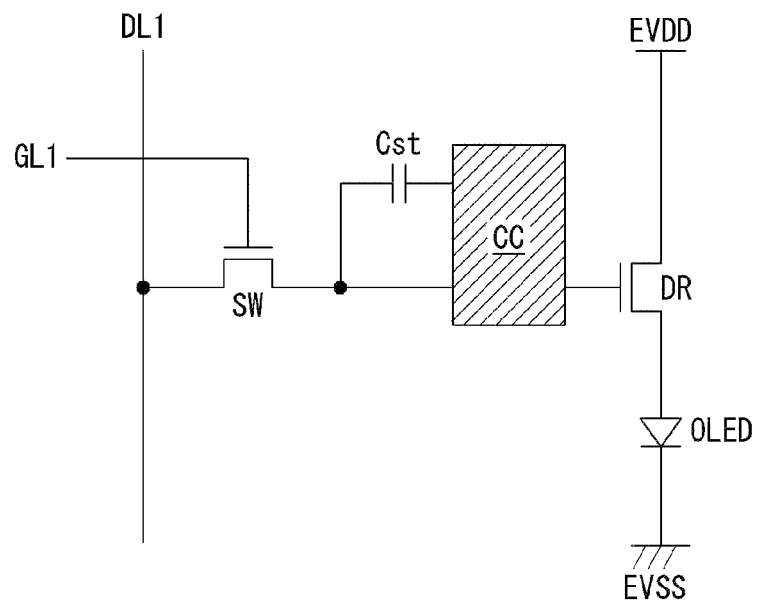
FIG. 2 is a schematic circuit of a subpixel.
Figure 3:
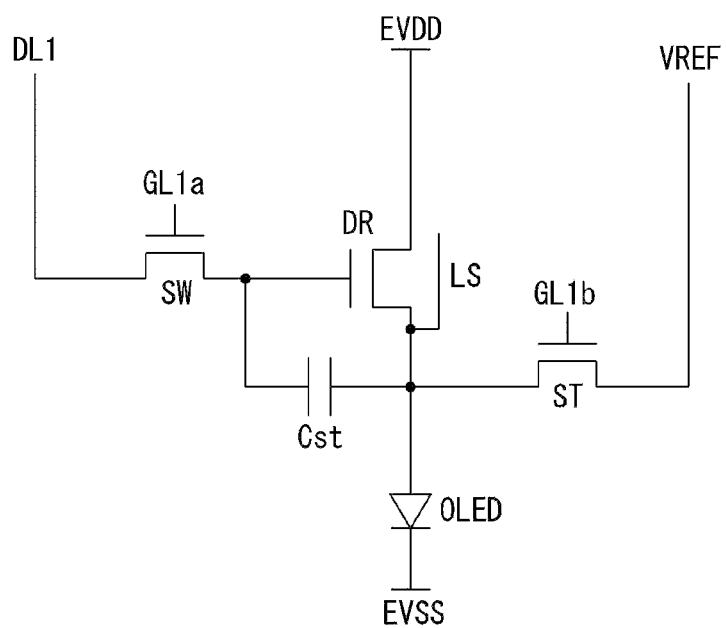
FIG. 3 is an exemplary circuit of a subpixel according to an embodiment of the present invention.
Figure 4:
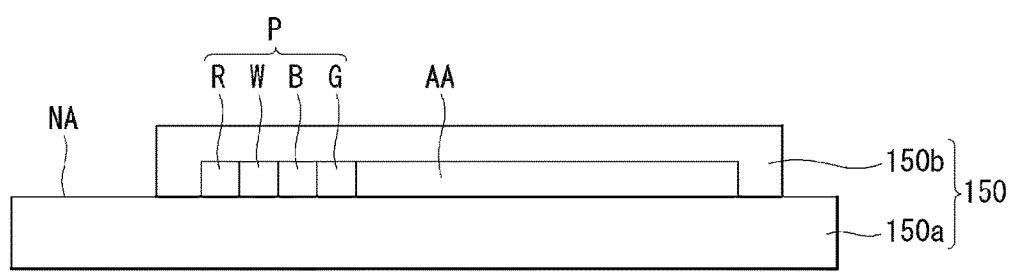
FIG. 4 is an exemplary cross-sectional view of a display panel according to an embodiment of the present invention.
Figure 5:
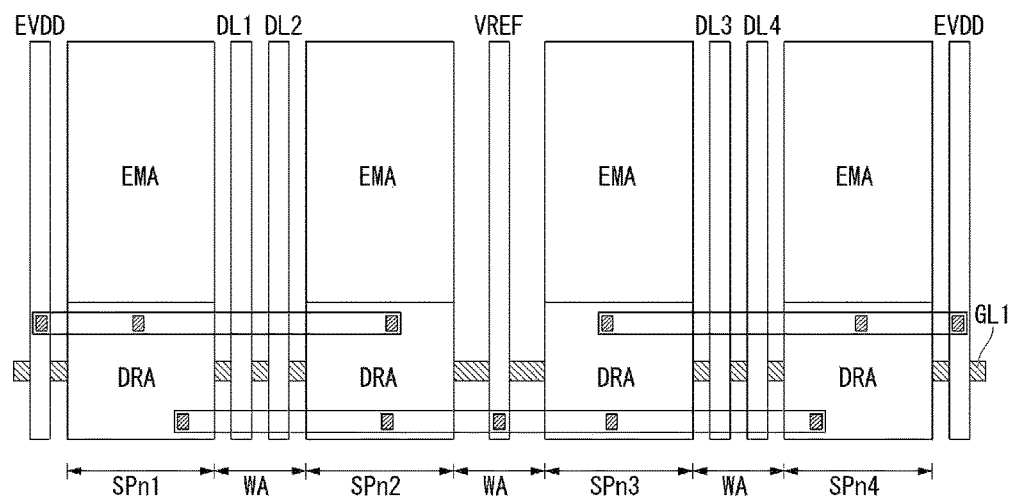
FIG. 5 is a exemplary top view of a subpixel according to an embodiment of the present invention.

FIG. 1 is a schematic block diagram illustrating an organic light emitting display device according to an embodiment of the present invention, FIG. 2 is a schematic circuit of a subpixel, FIG. 3 is an exemplary circuit of a subpixel according to an embodiment of the present invention, FIG. 4 is an exemplary cross-sectional view of a display panel according to an embodiment of the present invention, and FIG. 5 is a exemplary top view of a subpixel according to an embodiment of the present invention.

As illustrated in FIG. 1, the organic light emitting display device according to an embodiment of the present invention includes an image processing unit 110, a timing controller 120, a data driver 130, a scan driver 140, and a display panel 150.

The image processing unit 110 outputs a data enable signal DE as well as a data signal DATA supplied from the outside. Besides the data enable signal DE, the image processing unit 110 may output at least one of a vertical synchronization signal, a horizontal synchronization signal, and a clock signal, but these signals are omitted in the drawings for convenience of explanation.

The timing controller 120 receives the supply of a data signal DATA as well as a driving signal, which includes a data enable signal DE or a vertical synchronization signal, a horizontal synchronization signal, and a clock signal from the image processor 110, from the image processing unit 110. The timing controller 120 outputs a gate timing control signal GDC for controlling operation timing of the scan driver 140 and a data timing control signal DDC for controlling operation timing of the data driver 130 based on a driving signal.

The data driver 130 samples and latches a data signal DATA supplied from the timing controller 120 in response to a data timing control signal DDC supplied from the timing controller 120, converts the data signal DATA to a gamma reference voltage, and outputs the gamma reference voltage. The data driver 130 outputs a data signal DATA through data lines DL1-DLn. The data driver 130 is in the form of an Integrated Circuit (IC).

The scan driver 140 outputs a scan signal while shifting a level of a gate voltage in response to a gate timing control signal GDC supplied from the timing controller 120. The scan driver 140 outputs a scan signal through scan lines GL1-GLm. The scan driver 140 is in the form of an Integrated Circuit (IC) or is formed in a Gate In Panel structure (GIP) on the display panel 150.

The display panel 150 displays an image to correspond to a data signal DATA and a scan signal supplied from the data driver 130 and the scan driver 140. The display panel 150 includes subpixels SP which operate to display an image.

The subpixels SP include a red subpixel, a green subpixel, and a blue subpixel or include a white subpixel, a red subpixel, a green subpixel, and a blue subpixel. The subpixels SP may have at least one different emitting area according to a light emitting characteristic.

As illustrated in FIG. 2, one subpixel includes a switching transistor SW, a driving transistor DR, a capacitor Cst, a compensation circuit CC, and an organic light emitting diode.

In response to a scan signal supplied through a first scan line GL, the switching transistor SW performs a switching operation so that a data signal supplied through a first data line DL1 is stored as a data voltage in the capacitor Cst. According to the data voltage stored in the capacitor Cst, the driving transistor DR operates so that a driving current flows between a first power line EVDD and a second power line EVSS. The organic light emitting diode emits light according to the driving current generated by the driving transistor DR.

The compensation circuit CC is a circuit added to a subpixel in order to compensate for a threshold voltage of the driving transistor DR. The compensation circuit CC is composed of one or more transistors. The configuration of the compensation circuit CC varies depending on a compensation method, and one example thereof is as below As illustrated in FIG. 3, the compensation circuit CC includes a sensing transistor ST and a sensing line VREF. The sensing transistor ST is connected between a source line of the driving transistor DR and an anode electrode (hereinafter, referred to as a sensing node) of the organic light emitting diode. The sensing transistor ST operates to enable supplying an initialization voltage (or a sensing voltage), transferred through the sensing line VREF, to the sensing node, or to enable sensing a voltage or current in the sensing node.

The switching transistor SW includes a first electrode of the switching transistor SW connected to the first data line DL1, and a second electrode connected to a gate electrode of the driving transistor DR. The driving transistor DR includes a first electrode connected to the first power line EVDD, and a second electrode connected to the anode electrode of the organic light emitting diode. The capacitor Cst includes a first electrode connected to a gate electrode of the driving transistor DR, and a second electrode connected to the anode electrode of the organic light emitting diode. The organic light emitting diode includes the anode electrode connected to the second electrode of the driving transistor DR, and a cathode electrode connected to the second power line EVSS. The sensing transistor ST includes a first electrode connected to the sensing line VREF, and a second electrode connected to the anode of the organic light emitting diode.

Operating time of the sensing transistor may be similar/identical to or different from operating time of the switching transistor SW according to an algorithm (or configuration of the compensation circuit). For example, the switching transistor SW may include a gate electrode connected to a first scan line a GL1a, and the sensing transistor may include a gate electrode connected to a first scan line b GL1b. In another example, a first scan line GL1a connected to a gate electrode of the switching transistor SW and a first scan line b GL1b connected to a gate electrode of the sensing transistor ST may be connected for sharing.

The sensing line VREF may be connected to the data driver. In this case, during a non-display period or a N-th frame period (N is an integral equal to or greater than 1), the data driver may sense a sensing node of a subpixel and generate a sensing result in real time. Meanwhile, the switching transistor SW and the sensing transistor ST may be turned on at the same time. In this case, a sensing operation by way of the sensing line VREF and a data outputting operation for outputting a data signal are divided (separated) by a time division method of the data driver.

In addition, a subject to be compensated according to a sensing result may be a data signal in a digital format, a data signal in an analog format, or a gamma. In addition, the compensation circuit, which generates a compensation signal (or a compensation voltage) and the like based on a sensing result, may be included in the data driver, included the timing controller, or provided as an additional circuit.

A light shield layer LS may be disposed in a lower portion of a channel area of the driving transistor DR, or may be disposed below both the lower portion of the channel area of the driving transistor DR and the lower portion of the channel area of the switching transistor SW and a channel area of the sensing transistor ST. The light shield layer LS may be used simply to shield light, or the light shield layer LS may be used for connection to a different electrode or line and used as an electrode which composes a capacitor.

A subpixel in the 3T(Transistor)IC(Capacitor) structure having a switch transistor SW, a driving transistor DR, a capacitor Cst, an organic light emitting diode, and a sensing transistor ST was described as an example with reference to FIG. 3, but a subpixel may have a 3T2C, 4T2C, 5T1C, or 6T2C structure when a compensation circuit CC is added.

As illustrated in FIG. 4, subpixels based on the circuit described above with reference to FIG. 3 are formed on a display area AA of a first substrate (or a TFT) 150a. The subpixels formed on the display area AA may be sealed by a protection film (or a protection substrate) 150b. Although not described or depicted, NA indicates a non-display area. The first substrate 150a may be formed of glass or a flexible material.

The subpixels are arranged horizontally or vertically on the display area AA in the order of: a red subpixel R, a white subpixel W, a blue subpixel B, and a green subpixels G. In addition, the red subpixel R, the white subpixel W, the blue subpixel B, and the green subpixels G form one pixel P. However, the order of arrangement of those subpixels may vary depending on a light emitting material, a light emitting surface, and configuration (or structure) of a compensation circuit. In addition, the red subpixel R, the blue subpixel B, and the green subpixel G may form one pixel P.

As illustrated in FIGS. 4 and 5, first to fourth subpixels SPn1 to SPn4 each having an emitting area EMA and a circuit area DRA may be formed on the display area AA of the first substrate 150a. An organic light emitting diode is formed in the emitting area EMA, while a TFT including a switching transistor and a driving transistor is formed in the circuit area DRA. Devices formed in the emitting area EMA and the circuit area DRA may be formed through a deposition process of a plurality of metal layers and insulating layers.

In response to operation of a switching transistor and a driving transistor located in the circuit area DRA, an organic light emitting diode located in an emitting area EMA of each of the first to fourth subpixels SPn1 to SPn4 emits light. "WA" located between the first to fourth subpixels SPn1 to SPn4 refers to an wiring area in which a power line or a data line are arranged.

A first power line may be located on the left side of the first subpixel SPn1, a reference line REF may be located on the right side of a second subpixel SPn2, and first and second data lines DL1 and DL2 may be located between the first subpixel SPn1 and the second subpixel SPn2.

A reference line REF may be located on the right side of the third subpixel SPn3, a first power line EVDD may be located on the right side of the fourth subpixel SPn4, and third and fourth data lines DL3 and DL4 may be located between the third subpixel SPn3 and the fourth subpixel SPn4.

The first subpixel SPn1 may be electrically connected to the first power line EVDD located on the left side of the first subpixel SPn1, to the first data line DL1 located on the right side of the first subpixel SPn1, and to the reference line REF located on the right side of the second subpixel SPn2. The second subpixel SPn2 may be electrically connected to the first power line EVDD located on the left side of the first subpixel SPn1, the second data line DL2 located on the left side of the second subpixel SPn2, and the reference line REF located on the right side of the second subpixel SPn2.

The third subpixel SPn3 may be electrically connected to the reference line REF located on the left side of the third subpixel SPn3, to the third data line DL3 located on the right side of the third subpixel SPn3, and to the first power line EVDD located on the right side of the fourth subpixel SPn4. The fourth subpixel SPn4 may be electrically connected to the reference line REF located on the left side of the third subpixel SPn3, the fourth data line DL4 located on the left side of the fourth subpixel SPn4, and the first power line EVDD located on the right side of the fourth subpixel SPn4.

The first subpixel SPn1 to the fourth subpixel SPn4 may establish a sharing (or common) connection to the reference line REF located between the second subpixel SPn2 and the third subpixel Spn3, but aspects of the present invention is not limited thereto. In addition, the above description is about an example in which only a single scan line GL is arranged, but aspects of the present invention is not limited thereto.

Electrodes composing a TFT as well as wires, such as the first power line EVDD and the reference line REF, are positioned on different layers but electrically connected to each other since they contact each other through a contact hole (a via hole). The contact hole is formed by dry etching or wet etching so that an electrode, a signal line, or a power line located in low layers is partially exposed.

A display panel is implemented to have a large screen and high resolution. Accordingly, the number of multiple layers and insulating layers required to form on a substrate of the display panel is increasing. In addition, the layout for designing a substrate becomes more complex, and there is an increasing probability that short defect occurs between metal layers positioned on different layers due to tearing of a layer by a foreign material. Thus, there is need for solving those problems.

Hereinafter, experimental examples are selected, a short defect possibly occurring in each experimental example is explored, and an embodiment for solving a problem in each case is described. However, the following experimental examples and embodiments are not limited to the present invention.

Experimental Examples

Figure 6:
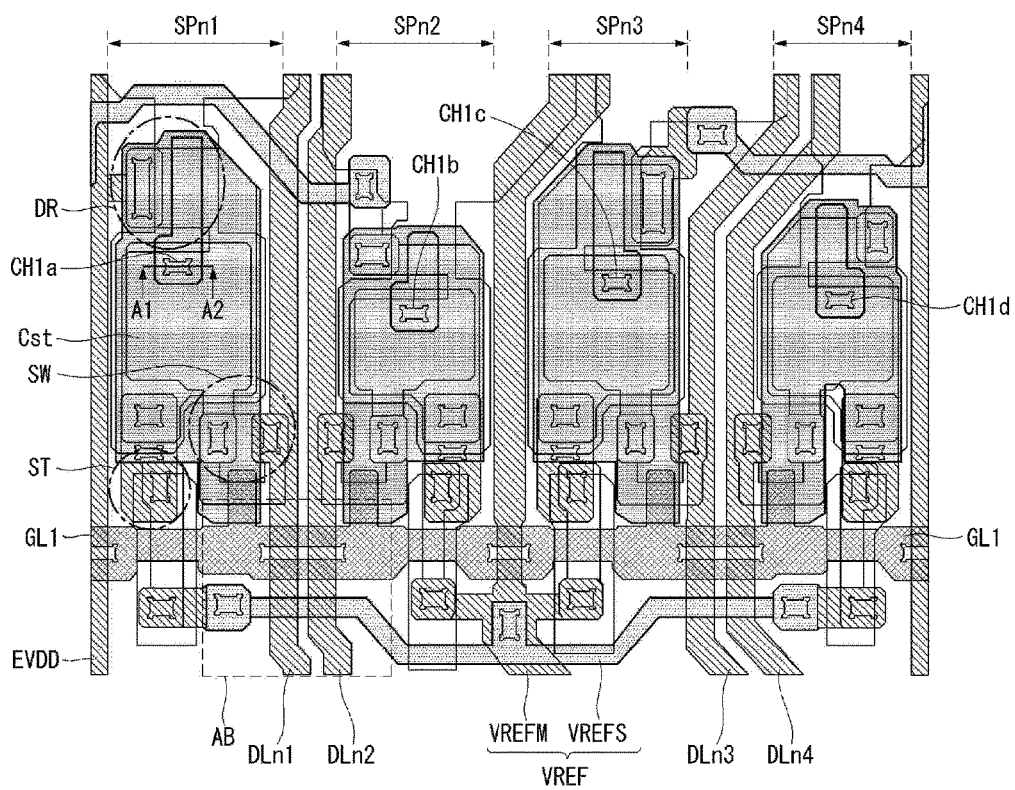
FIG. 6 is a top view showing some of subpixels according to an experimental example.
Figure 7:
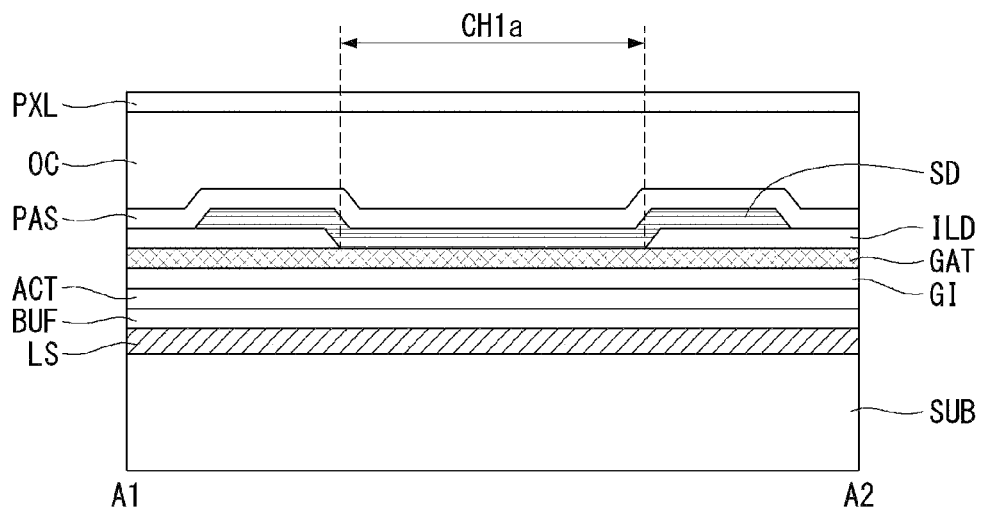
FIG. 7 is a cross-sectional view of A1-A2 area shown in FIG. 6.
Figure 7:
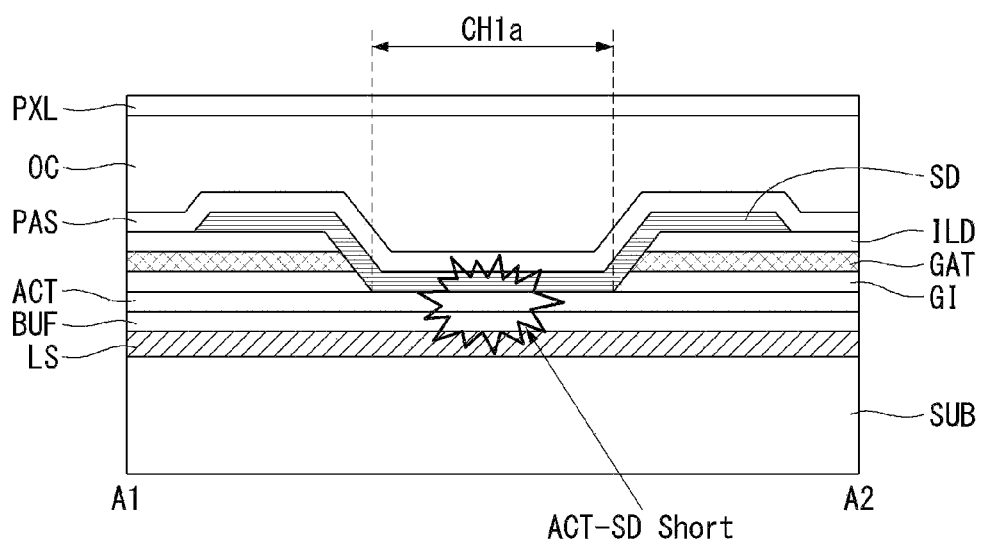

FIG. 6 is a top view showing some of subpixels according to an experimental example, and FIG. 7 is a cross-sectional view of A1-A2 area shown in FIG. 6.

As illustrated in FIG. 6, first to fourth subpixels SPn1 to SPn4 horizontally arranged on a display panel form a single pixel. For example, the first subpixel SPn1 is a red subpixel R, a second subpixel SPn2 is a white subpixel W, a third subpixel SPn3 is a blue subpixel B, and the fourth subpixel SPn4 is a green subpixel G. The number of pixels to be arranged corresponds to resolution.

A first power line EVDD is vertically arranged on the left side of the first subpixel SPn1. The first power line EVDD is connected to both the first subpixel SPn1 and the second subpixel SPn2. A first data line DLn1 and a second data line DLn2 are vertically arranged between the first subpixel SPn1 and the second subpixel SPn2 (WA). The first data line DLn1 is connected to the first subpixel SPn1, and the second data line DLn2 is connected to the second subpixel SPn2.

A sensing line VEREF is vertically arranged on the left side of the third subpixel SPn3. The sensing line VREF is connected to all of the first to fourth subpixels SPn1 to SPn4. A third data line DLn3 and a fourth data line DLn4 are vertically arranged between the third subpixel SPn3 and the fourth subpixel SPn4 (WA). The third data line DLn3 is connected to the third sub pixel SPn3, and the fourth data line DLn4 is connected to the subpixel SPn4.

A first scan line GL1 is vertically arranged in an area of a sensing transistor ST included each of the first to fourth subpixels SPn1 to SPn4. The first scan line GL1 is connected to a gate electrode of the sensing transistor ST and a gate electrode of a switching transistor SW.

The sensing line VREF includes a vertical sensing line VREFM which is vertically arranged, and a horizontal sensing line VREFS which is horizontally arranged. In the experimental example, the sensing line VREF utilizes the sensing line VREFS as a connection electrode (or a bridge electrode) so as to connect the sensing line VREF to all of the first to fourth subpixels SPn1 to SPn4.

As illustrated in FIG. 7, a light shield layer LS is formed on a first substrate SUB. A buffer layer BUF is formed on the light shield layer Ls. A semiconductor layer ACT is formed on the buffer layer BUF. A first insulating layer GI is formed on the semiconductor layer ACT. A gate metal layer GAT is formed on the first insulating layer GI. A second insulating layer ILD having a first contact hole CH1a is formed on the gate metal layer GAT. A source drain metal layer SD is formed on the second insulating layer ILD. A protection layer PAS is formed on the source drain metal layer SD. A third insulating layer OC is formed on the protection layer PAS. A pixel electrode PXL is formed on the third insulating layer OC.

As illustrated in FIGS. 3, 6, and 7, a capacitor Cst is connected to a gate electrode and a second electrode of a driving transistor DR. The capacitor Cst includes a first electrode composed of the source drain metal layer SD positioned above the first insulating layer GI, and a second electrode composed of a metalized semiconductor layer ACT positioned below the first insulating layer GI. The capacitor Cst includes a first electrode connected to the gate electrode of the driving transistor DR, and a second electrode connected to an anode electrode of an organic light emitting diode.

The source drain metal layer SD acting as the first electrode of the capacitor Cst is electrically connected through the first contact hole CH1a to a gate metal layer GAT disposed below the source drain metal layer SD. The gate metal layer GAT composes the gate electrode of the driving transistor DR.

In the structure according to the above experimental example, even when an abnormal condition is created due to over-etching or tearing of a layer in the process of forming a contact hole after a deposition process, a short occurs between electrode layers positioned on different layers, and detailed description thereof is as below.

[When the First Contact Hole (CH1a) is Normally Formed]

As shown in portion (a) of FIG. 7, a source drain metal layer SD is, through a first contact hole (CH1a), in surface-to-surface contact with a gate metal layer GAT positioned below the source drain metal layer SD, and electrically connected to the gate metal layer GAT.

[When the First Contact Hole (CH1a) is Abnormally Formed]

As illustrated in portion (b) of FIG. 7, the source drain metal layer SD is, through a contact hole CH1a, in surface-to-surface contact and lateral side contact with the gate metal layer GAT positioned below the source drain metal layer SD, and electrically connected to the gate metal layer GAT. In addition, the source drain metal layer SD is, through the contact hole CH1a, in surface-to-surface contact with a metalized semiconductor layer ACT positioned below the gate metal layer GAT, and electrically connected to the metalized semiconductor layer ACT.

In this case, a short (ACT-AD short) occurs between the source drain metal layer SD and the metalized semiconductor layer ACT. This causes a capacitor to disappear from where the capacitor is supposed to exist. As a result, a subpixel in which the short has occurred malfunctions.

First Embodiment

Figure 8:
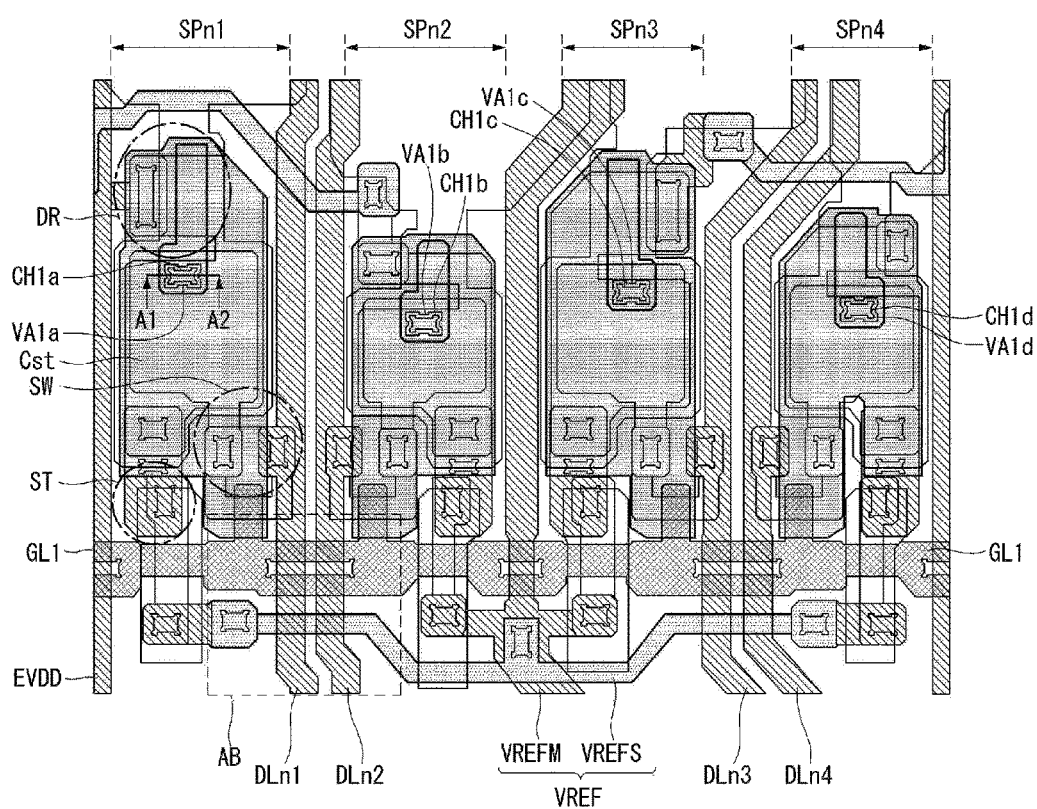
FIG. 8 is a top view showing some of subpixels according to the first embodiment.
Figure 9:
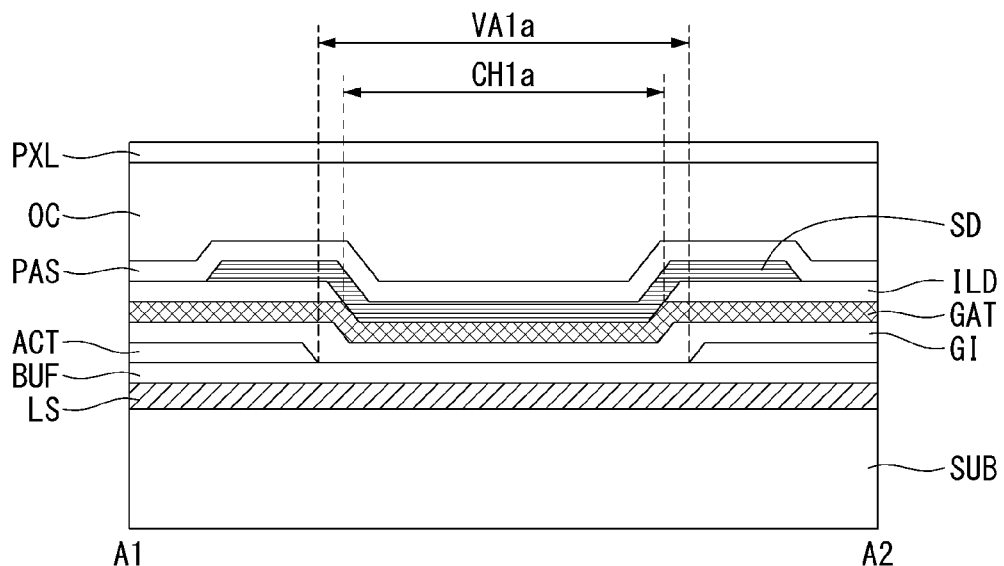
FIG. 9 is a cross-sectional view of A1-A2 area shown in FIG. 8.
Figure 9:
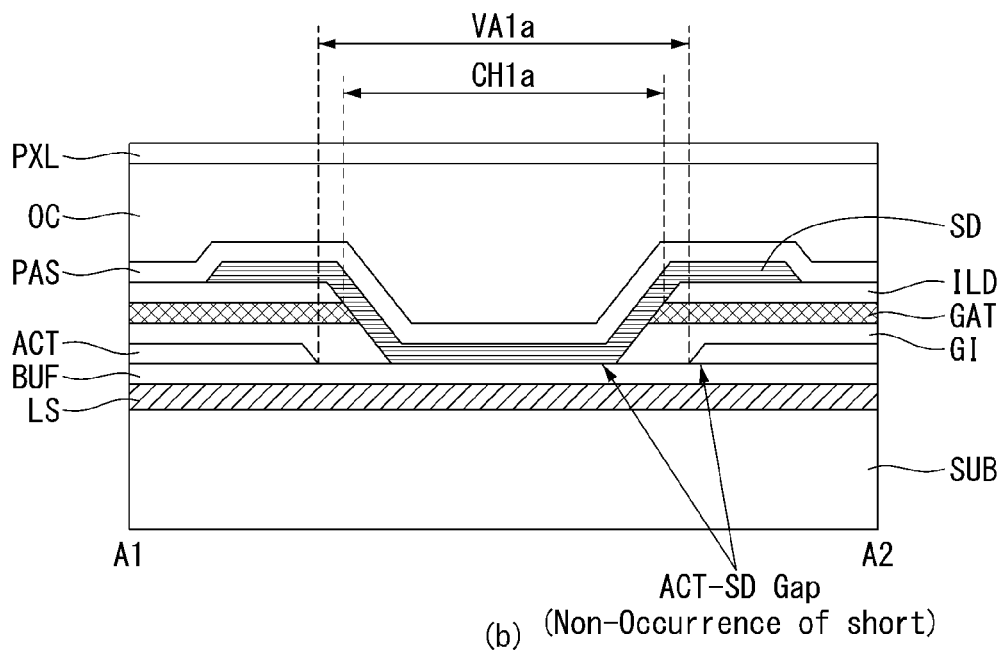
Figure 10:
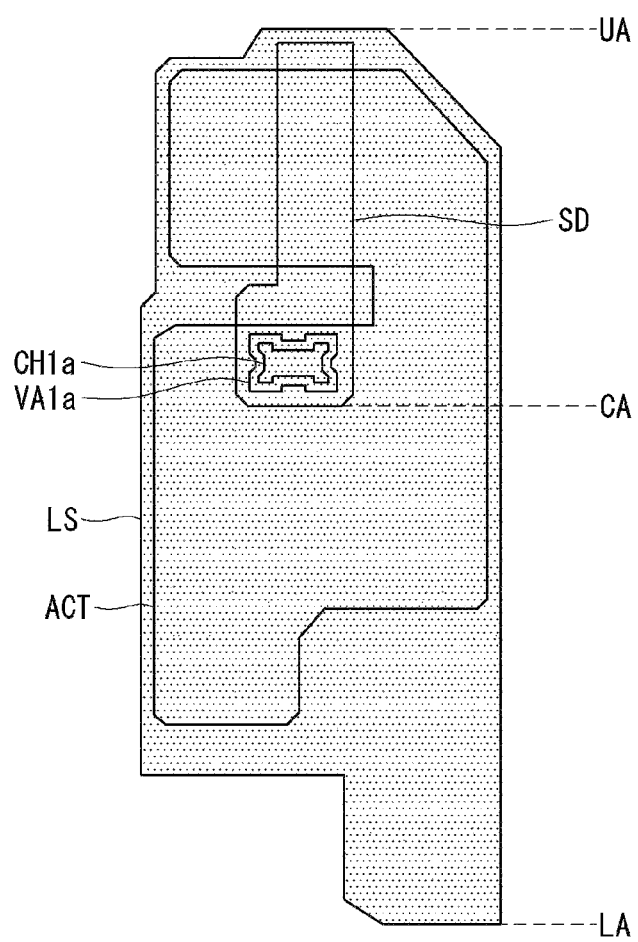
FIG. 10 is a top view showing the details of a first contact hole and a first auxiliary contact hole according to the first embodiment.

FIG. 8 is a top view showing some of subpixels according to the first embodiment, FIG. 9 is a cross-sectional view of A1-A2 area shown in FIG. 8, and FIG. 10 is a top view showing the details of a first contact hole and a first auxiliary contact hole according to the first embodiment.

As illustrated in FIG. 8, first to fourth subpixels SPn1 to SPn4 vertically arranged on a display panel composes one pixel. For example, the first subpixel SPn1 may be a red subpixel R, a second subpixel SPn2 may be a white subpixel W, a third subpixel SPn3 may be a blue subpixel B, and the fourth subpixel SPn4 may be a green subpixel G. The number of pixels to be arranged corresponds to resolution.

A first power line EVDD is vertically arranged on the left side of the first subpixel SPn1. The first power line EVDD is connected to both the first subpixel SPn1 and the second subpixel SPn2. A first data line DLn1 and a second data line DLn2 are arranged between the first subpixel SPn1 and the second subpixel SPn2 (WA). The first data line DLn1 is connected to the first subpixel SPn1, and the second data line DLn2 is connected to the second subpixel SPn2.

A sensing line VREF is vertically arranged on the left side of the third subpixel SPn3. The sensing line VREF is connected to all of the first to fourth subpixels SPn1 to SPn4. A third data line DLn3 and a fourth data line DLn4 are arranged between the third subpixel DLn3 and the fourth subpixel SPn4 (WA). The third data line DLn3 is connected to the third subpixel SPn3, and the fourth data line DLn4 is connected to the fourth subpixel SPn4.

A first scan line GL1 is vertically arranged in an area of a sensing transistor ST included in each of the first to fourth subpixels SPn1 to SPn4. The first scan line GL1 is connected to a gate electrode of the sensing transistor ST and a gate electrode of a switching transistor SW.

The sensing line VREF includes a vertical sensing line VREFM which is vertically arranged, and a horizontal sensing line VREFS which is horizontally arranged. In the experimental example, the horizontal sensing line VREFS is utilized as a connection electrode (or a bridge electrode) so as to connect the sensing line VREF to all of the first to fourth subpixels SPn1 to SPn4.

As illustrated in FIG. 9, a light shield layer Ls is formed on a first substrate SUB. The light shield layer LS is formed of a metal or conductive material. The light shield layer LS is in the form of a surface electrode that occupies more than a half of the circuit area of a subpixel in order to cover a semiconductor layer (or a channel area) of a transistor. The configuration of the light shield layer Ls is not limited to what is shown in the drawings.

A buffer layer BUF is formed on the light shield layer LS. The buffer layer BUF is composed of a single layer or multiple layers. The buffer layer BUF may be, for example, alternatively deposited layers of silicon oxide SiOx and silicon nitride SiNx.

A semiconductor layer ACT is formed on the buffer layer BUF. The semiconductor layer ACT is formed of an oxide semiconductor. The semiconductor layer ACT may be, for example, IGZO that consists of indium (In), gallium (Ga), zinc (Zn), and oxygen (O). A source area and a drain area of the semiconductor layer ACT, except a channel area thereof, are metalized by dry etching or a thermal processing method.

A first insulating layer GI is formed on the semiconductor layer ACT. The first insulating layer GI may be defined as a gate insulating layer. The first insulating layer GI is composed of a single layer or multiple layers. The first insulating layer GI may be, for example, composed of a silicon oxide layer SiOx, a silicon nitride layer SiNx layer, or a layer of compound of silicon oxide SiOx and a silicon nitride SiNx.

A gate metal layer GAT is formed on the first insulating layer GI. The gate metal layer GAT may be one selected from among molybdenum (Mo), aluminum (Al), chrome (Cr), gold (Au), titanium (Ti), nickel (Ni), and copper Cu or may be an alloy thereof, and the gate metal layer GAT may be composed of a single layer or multiple layers.

A second insulating layer ILD having a first contact hole CH1a is formed on the gate metal layer GAT. The first contact hole CH1a exposes a portion of the gate metal layer GAT. The second insulating layer ILD may be defined as an inter-insulating layer. The second insulating layer ILD is composed of a single layer or multiple layers. The second insulating layer ILD may be, for example, composed of a silicon oxide layer SiOx, a silicon nitride SiNx, or a layer of compound thereof.

A source drain metal layer SD is formed on the second insulating layer ILD. The source drain metal layer SD is electrically in contact with the gate metal layer GAT through the first contact hole CH1a. The source drain metal layer SD may be one selected from among molybdenum (Mo), aluminum (Al), chrome (Cr), gold (Au), titanium (Ti), nickel (Ni), and copper Cu, or may be an alloy thereof, and the source drain metal layer SD may be composed of a single layer or multiple layers.

A protection layer PAS is formed on the source drain metal layer SD. The protection layer PAS is composed of a single layer or multiple layers. The protection layer PAS may be, for example, a silicon oxide SioX layer, a silicon nitride layer SiNx, or a layer of compound thereof.

A third insulating layer OC is formed on the protection layer PAS. The third insulating layer OC may be defined as a planar layer. The third insulating layer OC may be composed of an organic material, such as polyimide, benzocyclobutene series resin, acrylate, and photoacrylate.

A pixel electrode PXL is formed on the third insulating layer OC. The pixel electrode PXL is selected between an anode electrode and a cathode electrode of an organic light emitting diode. The pixel electrode PXL may be composed of a transparent oxide electrode, such as indium tin oxide (ITO) and a indium zinc oxide (IZO).

As illustrated in FIGS. 3, 8, and 9, a capacitor Cst is connected to a gate electrode and a second electrode of a driving transistor DR. The capacitor Cst includes a first electrode composed of the source drain metal layer SD positioned above the first insulating layer, and a second electrode composed of the metalized semiconductor layer ACT positioned underneath the first insulating layer GI. The capacitor Cst includes a first electrode connected to the gate electrode of the driving transistor DR, and a second electrode to the anode electrode of the organic light emitting diode.

The source drain metal layer SD acting as the first electrode of the capacitor Cst is electrically connected through the first contact hole CH1a to the gate metal layer GAT positioned below the source drain metal layer SD. The gate metal layer GAT composes a gate electrode of the driving transistor DR. A first auxiliary contact hole VA1a is formed in an area which corresponds to the first contact hole CH1a on the metalized semiconductor layer ACT. The first auxiliary contact hole VA1a is formed on a conducting layer that is positioned three layers lower than the first contact hole CH1a. The first auxiliary contact hole VA1a and the first contact hole CH1a are disposed in the outer area of the conducting layer.

In the structure according to the first embodiment, even when an abnormal condition is created due to over-etching or tearing of a layer in the process of forming the first contact hole CH1a after a disposition process, a short does not occur between electrode layers positioned on different layers, and detailed description thereof is as below.

[When the First Contact Hole CH1a is Normally Formed]

As illustrated in portion (a) of FIG. 9, the source drain metal layer SD is, through the first contact hole CH1a, in surface-to-surface contact with the gate metal layer GAT positioned below the source drain metal layer SD, and electrically connected to the gate metal layer GAT.

[When the First Contact Hole CH1a is Abnormally Formed]

As illustrated in portion (b) of FIG. 9, the source drain metal layer SD is, through the first contact hole CH1a, in surface-to-surface contact with and lateral side contact with the gate metal layer GAT positioned below the source drain metal layer SD, and in a surface contact with the buffer layer BUF positioned below the gate metal layer GAT.

However, the first auxiliary contact hole VA1a is formed in an area corresponding to the contact hole CH1a on the metalized semiconductor layer ACT, and thus, the source drain metal layer SD never comes into contact with the semiconductor layer ACT, even when coming down to where the buffer layer BUF is positioned.

As such, in the first embodiment, an additional contact hole is formed on a conducting layer (or a metal layer) positioned below an area in which a short is highly likely to occur, thereby reducing a probability of occurrence of an unintended short defect (ACT-SD gap, non-occurrence of short) between metal layers positioned on different layers. As a result, it is possible to address a defect that is disappearance of a capacitor due to a short (malfunction of a subpixel in which the short occurs). In addition, it is not necessary to come up with an avoidance design to avoid a probability of occurrence of a short defect in an area where the capacitor (removing a portion of a metalized semiconductor layer) is formed, and thus, it is possible to solve a reduced area or degradation in performance of the capacitor.

As illustrated in FIGS. 9 and 10, the first contact hole CH1a and the first auxiliary contact hole VA1a are disposed adjacent to a central portion CA of the circuit area. The first contact hole CH1a and the first auxiliary contact hole VA1a are in a rectangular shape having a horizontal length longer than a vertical length. However, the shape of the contact holes are not limited to what is shown in the drawings.

The first auxiliary contact hole VA1a is added to reduce a probability of occurrence of an unintended short defect between metal layers positioned on different layers. The size of the first auxiliary contact hole VA1a is preferably larger than the size of the first contact hole CH1a. This condition is useful when isotropic etching is employed. However, even when the first auxiliary contact hole VA1A is in size similar or identical to the first contact hole CH1a, it is possible to reduce a probability of occurrence of short defect. This condition is useful when anisotropic etching is employed.

Meanwhile, the present invention is applicable not just the first contact hole, but other portions, and detailed description thereof is as below.

Second Embodiment

Figure 11:
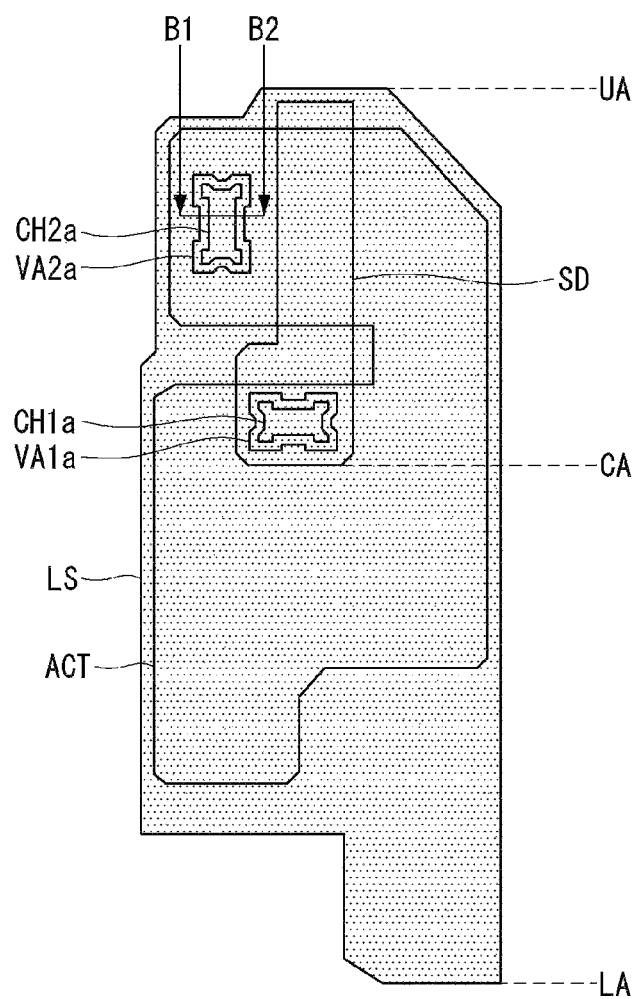
FIG. 11 is a top view showing details of a second contact hole and a second auxiliary contact hole according to a second embodiment.
Figure 12:
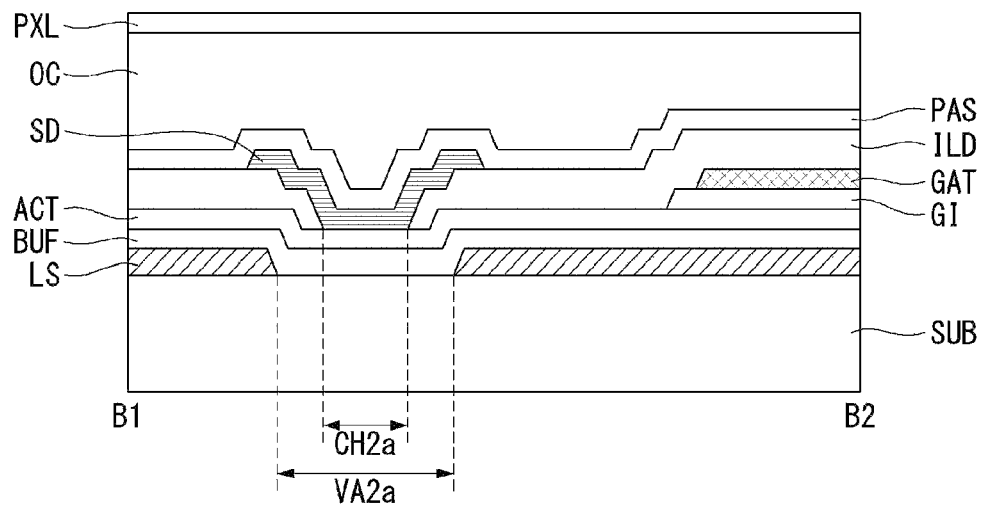
FIG. 12 is a cross-sectional view of B1-B2 area shown in FIG. 11.
Figure 12:
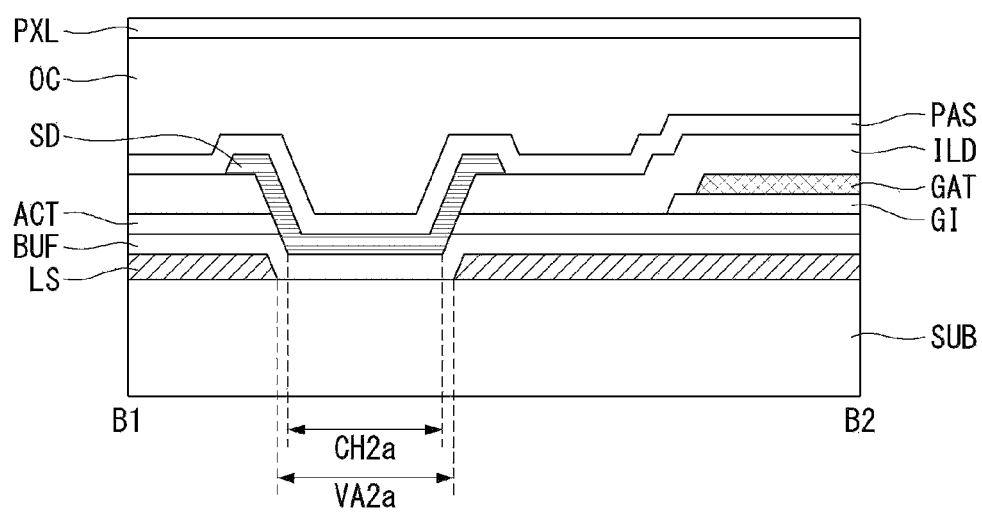

FIG. 11 is a top view showing details of a second contact hole and a second auxiliary contact hole according to a second embodiment, and FIG. 12 is a cross-sectional view of B1-B2 area shown in FIG. 12.

As illustrated in FIG. 11, a second contact hole CH2a and a second auxiliary contact hole VA2a are disposed adjacent to an upper portion UA of the circuit area. The second contact hole CH2a and the second auxiliary contact hole VA2a are in a rectangular shape having a vertical length longer than a horizontal length. However, the shape of the contact holes is not limited to what is shown in the drawings.

As illustrated in FIG. 12, a light shield layer Ls is formed on a first substrate SUB. The light shield layer LS is formed of a metal or conductive material. The light shield layer LS is in the form of a surface electrode that occupies more than a half of the circuit area of a subpixel to thereby cover a semiconductor layer (or a channel area) of a transistor. The light shield layer LS has a second auxiliary contact hole VA2a.

A buffer layer BUF is formed on the light shield layer LS. The buffer layer BUF is composed of a single layer or multiple layers. The buffer layer BUF may be, for example, alternatively deposited layers of silicon oxide SiOx and silicon nitride SiNx.

A semiconductor layer ACT is formed on the buffer layer BUF. The semiconductor layer ACT is formed of an oxide semiconductor. The semiconductor layer ACT may be, for example, IGZO that consists of indium (In), gallium (Ga), zinc (Zn), and oxygen (O). A source area and a drain area of the semiconductor layer ACT, except a channel area thereof, are metalized by dry etching or a thermal processing method.

A first insulating layer GI is formed on the semiconductor layer ACT. The first insulating layer GI may be defined as a gate insulating layer. The first insulating layer GI is composed of a single layer or multiple layers. The first insulating layer GI may be, for example, composed of a silicon oxide layer SiOx, a silicon nitride layer SiNx layer, or a layer of compound thereof.

A gate metal layer GAT is formed on the first insulating layer GI. The gate metal layer GAT may be one selected from among molybdenum (Mo), aluminum (Al), chrome (Cr), gold (Au), titanium (Ti), nickel (Ni), and copper Cu, or may be an alloy thereof, and the gate metal layer GAT may be composed of a single layer or multiple layers.

A second insulating layer ILD having the second contact hole CH2a is formed on the semiconductor layer ACT and the gate metal layer GAT. The second contact hole CH2a exposes a portion of a metalized semiconductor layer ACT. The second insulating layer ILD may be defined as an inter-insulating layer. The second insulating layer ILD is composed of a single layer or multiple layers. The second insulating layer ILD may be composed of a silicon oxide layer SiOx, a silicon nitride layer SiNx, or a layer of compound of silicon oxide SiOx and a silicon nitride SiNx.

A source drain metal layer SD is formed on the second insulating layer ILD. The source drain metal layer SD is electrically in contact with the metalized semiconductor layer ACT through the second contact hole CH2a. The source drain metal layer SD is formed on the first insulating layer GI. The gate metal layer GAT may be one selected from among molybdenum (Mo), aluminum (Al), chrome (Cr), gold (Au), titanium (Ti), nickel (Ni), and copper Cu, or may be an alloy thereof, and the source drain metal layer SD may be composed of a single layer or multiple layers.

A protection layer PAS is formed on the source drain metal layer SD. The protection layer PAS is composed of a single layer or multiple layers. The protection layer PAS may be, for example, a silicon oxide SiOx layer, a silicon nitride layer SiNx, or a layer of compound of silicon oxide SiOx and a silicon nitride SiNx.

A third insulating layer OC is formed on the protection layer PAS. The third insulating layer OC may be defined as a planar layer. The third insulating layer OC may be composed of an organic material, such as polyimide, benzocyclobutene series resin, acrylate, and photoacrylate.

A pixel electrode PXL is formed on the third insulating layer OC. The pixel electrode PXL is selected between an anode electrode and a cathode electrode of an organic light emitting diode. The pixel electrode PXL may be composed of a transparent oxide electrode, such as indium tin oxide (ITO) and a indium zinc oxide (IZO).

As illustrated in FIGS. 3, 8, 11, and 12, the second contact hole CH2A is a portion formed to electrically connect a first power line EVDD to a first electrode of a driving transistor DR.

In the structure according to the second embodiment, even when an abnormal condition is created due to over-etching or tearing of a layer in the process of forming the first contact hole CH1a after a disposition process, a short does not occur between electrode layers positioned on different layers, and detailed description thereof is as below.

[When the Second Contact Hole CH2a is Normally Formed]

As illustrated in portion (a) of FIG. 12, the source drain metal layer SD is, through the first contact hole CH1a, in surface-to-surface contact with the metalized semiconductor layer ACT positioned below the source drain metal layer SD, and electrically connected to the conducting layer ACT.

[When the Second Contact Hole CH2a is Abnormally Formed]

As illustrated in portion (b) of FIG. 12, the source drain metal layer SD is, through the second contact hole CH2a, in surface-to-surface surface contact and lateral side contact with the metalized semiconductor layer ACT positioned below the source drain metal layer SD, and in surface-to-surface contact with the buffer layer BUF positioned below the light shield layer LS.

However, the second auxiliary contact hole VA2a is formed in an area corresponding to the second contact hole CH2a on the light shield layer LS, and thus, the source drain metal layer SD never comes into contact with the light shield layer LS even when coming down to where the buffer layer BUF is positioned or further down to where the first substrate SUB is positioned.

As such, in the second embodiment, an additional contact hole is formed on a conducting layer (or a metal layer) positioned below an area in which a short is highly likely to occur, thereby reducing a probability of occurrence of an unintended short defect between metal layers positioned on different layers. As a result, it is possible to address a defect that indicates a short occurring between a source electrode and a drain electrode of a driving transistor (malfunction of a subpixel in which the short occurs).

As illustrated in FIGS. 11 and 12, the second contact hole CH2a and the second auxiliary contact hole VA2a are disposed adjacent to an upper portion UA of the circuit area. The second auxiliary contact hole VA2a is added to reduce a probability of occurrence of an unintended short defect between metal layers positioned on different layers. The size of the second auxiliary contact hole VA2a is preferably larger than the size of the second contact hole CH2a. This condition is useful when isotropic etching is employed. However, even when the size of the second auxiliary contact hole VA2a is similar or equal to the size of the second contact hole CH2a, it is possible to reduce a probability of occurrence of a short defect. This condition is useful when anisotropic etching is employed.

Meanwhile, the present invention is applicable not just to a first contact hole and a second contact hole, but to other portions, and detailed description thereof is as below.

Third Embodiment

Figure 13:
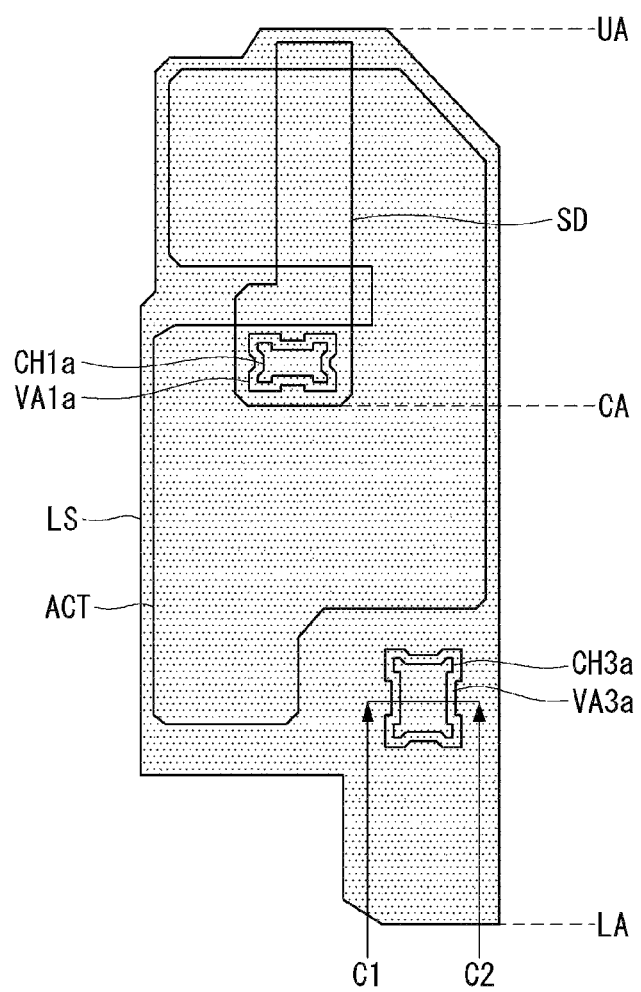
FIG. 13 is a top view showing details of a third contact hole and a third auxiliary contact hole according to a third embodiment.
Figure 14:
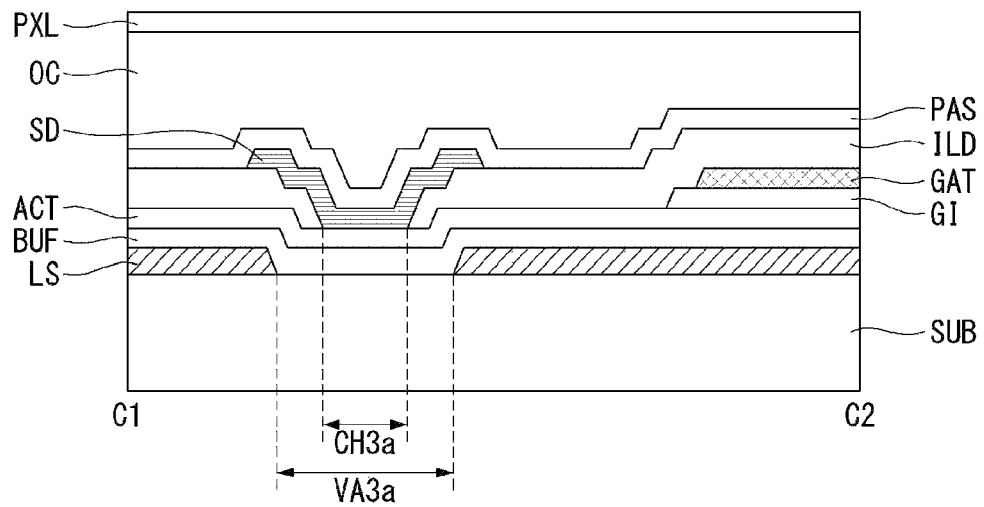
FIG. 14 is a cross-sectional view of C1-C2 area shown in FIG. 13.
Figure 14:
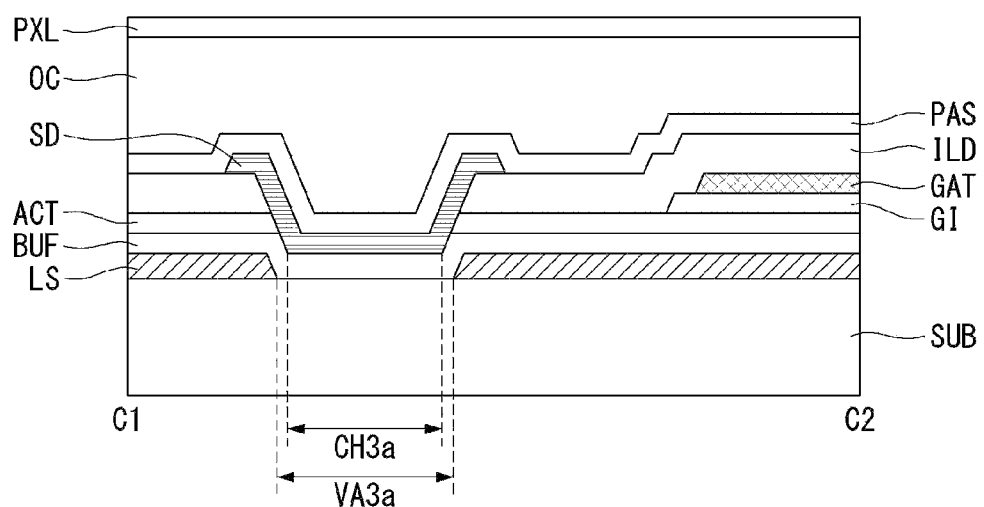

FIG. 13 is a top view showing details of a third contact hole and a third auxiliary contact hole according to a third embodiment, and FIG. 14 is a cross-sectional view of C1-C2 area shown in FIG. 13.

As illustrated in FIG. 13, a third contact hole CH3a and a third auxiliary contact hole VA3a are disposed adjacent to a lower portion LA of the circuit area. The third contact hole CH3a and the third auxiliary contact hole VA3a are in a rectangular shape having a vertical length longer than a horizontal length. However, the shape of the contact holes are not limited to what is shown in the drawings.

As illustrated in FIG. 14, a light shield layer Ls is formed on a first substrate SUB. The light shield layer LS is formed of a metal or conductive material. The light shield layer LS is in the form of a container electrode (or a surface electrode) that occupies more than a half of the circuit area of a subpixel to cover a semiconductor layer (or a channel area) of a transistor. The light shield layer LS has a second auxiliary contact hole VA3a.

A buffer layer BUF is formed on the light shield layer LS. The buffer layer BUF is composed of a single layer or multiple layers. The buffer layer BUF may be, for example, alternatively deposited layers of silicon oxide SiOx and silicon nitride SiNx.

A semiconductor layer ACT is formed on the buffer layer BUF. The semiconductor layer ACT is formed of an oxide semiconductor. The semiconductor layer ACT may be, for example, IGZO that consists of indium (In), gallium (Ga), zinc (Zn), and oxygen (O). A source area and a drain area of the semiconductor layer ACT, except a channel area thereof, are metalized by dry etching or a thermal processing method.

A first insulating layer GI is formed on the semiconductor layer ACT. The first insulating layer GI may be defined as a gate insulating layer. The first insulating layer GI is composed of a single layer or multiple layers. The first insulating layer GI may be, for example, composed of a silicon oxide layer SiOx, a silicon nitride layer SiNx layer, or a layer of compound of silicon oxide SiOx and a silicon nitride SiNx.

A gate metal layer GAT is formed on the first insulating layer GI. The gate metal layer GAT may be one selected from among molybdenum (Mo), aluminum (Al), chrome (Cr), gold (Au), titanium (Ti), nickel (Ni), and copper Cu, or may be an alloy thereof, and the gate metal layer GAT may be composed of a single layer or multiple layers.

A second insulating layer ILD having the third contact hole CH3a is formed on the semiconductor layer ACT and the gate metal layer GAT. The second contact hole CH2a exposes a portion of the metalized semiconductor layer ACT. The second insulating layer ILD may be defined as an inter-insulating layer. The second insulating layer ILD is composed of a single layer or multiple layers. The second insulating layer ILD may be composed of a silicon oxide layer SiOx, a silicon nitride layer SiNx, or a layer of compound of silicon oxide SiOx and a silicon nitride SiNx.

A source drain metal layer SD is formed on the second insulating layer ILD. The source drain metal layer SD is electrically in contact with the metalized semiconductor layer ACT through the third contact hole CH3a. The source drain metal layer SD is formed on the first insulating layer GI. The gate metal layer GAT may be one selected from among molybdenum (Mo), aluminum (Al), chrome (Cr), gold (Au), titanium (Ti), nickel (Ni), and copper Cu, or may be an alloy thereof, and the source drain metal layer SD may be composed of a single layer or multiple layers.

A protection layer PAS is formed on the source drain metal layer SD. The protection layer PAS is composed of a single layer or multiple layers. The protection layer PAS may be, for example, a silicon oxide SiOx layer, a silicon nitride layer SiNx, or a layer of compound of silicon oxide SiOx and a silicon nitride SiNx.

A third insulating layer OC is formed on the protection layer PAS. The third insulating layer OC may be defined as a planar layer. The third insulating layer OC may be composed of an organic material, such as polyimide, benzocyclobutene series resin, acrylate, and photoacrylate.

A pixel electrode PXL is formed on the third insulating layer OC. The pixel electrode PXL is selected between an anode electrode and a cathode electrode of an organic light emitting diode. The pixel electrode PXL may be composed of a transparent oxide electrode, such as indium tin oxide (ITO) and a indium zinc oxide (IZO).

As illustrated in FIGS. 3, 8, 13, and 14, a third contact hole CH3a is a portion formed to electrically connect a first electrode of a switching transistor SW to a first data line DLn1. Meanwhile, the third contact hole CH3a may be a portion formed to electrically connect an anode electrode of an organic light emitting diode to a second electrode of a sensing transistor ST.

In the structure according to the third embodiment, even when an abnormal condition is created due to over-etching or tearing of a layer in the process of forming the third contact hole CH3a after a deposition process, a short does not occur between electrode layers positioned on different layers, and descriptions thereof is as below.

[When the Third Contact Hole CH3a is Normally Formed]

As illustrated in portion (a) of FIG. 14, a source drain metal layer SD is, through the third contact hole CH3a, in contact with the metalized semiconductor layer ACT positioned below the source drain metal layer SD, and electrically connected to the metalized semiconductor layer ACT.

[When the Third Contact Hole CH3a is Abnormally Formed]

As illustrated in portion (b) of FIG. 14, the source drain metal layer SD is, through the third contact hole CH3a, in surface-to-surface contact and lateral side contact with the metalized semiconductor layer ACT positioned below the source drain metal layer SD, and also in surface-to-surface contact with a buffer layer BUF positioned below a light shield layer LS.

However, a third auxiliary contact hole VA3a is formed in an area corresponding to the third contact hole CH3a on the light shield layer LS, and thus, the source drain metal layer SD never comes into contact with the light shield layer LS, even when coming down to where the buffer layer BUF or further down to where the first substrate SUB is positioned.

As such, in the third embodiment, a probability of occurrence of an unintended short defect between metal layers positioned on different layers may be reduced, by further forming a contact hole on a conductor layer or a metal layer) existing below an area having a high probability of occurrence of a short. As a result, it is possible to address a defect that indicates a short occurring between a source electrode and a drain electrode of the switching transistor (malfunction of a subpixel in which the short occurs).

As illustrated in FIGS. 13 and 14, the third contact hole CH3a and the third auxiliary contact hole VA3a are disposed adjacent to a lower portion LA of the circuit area. The third auxiliary contact hole VA3a is added to reduce a probability of occurrence of an unintended short defect between metal layers positioned on a different layers. The size of the third auxiliary contact hole VA3a is preferably larger than the size of the third contact hole CH3a. This condition is useful when isotropic etching is employed. However, even when the size of the third auxiliary contact hole VA3A is similar or equal to the size of the third contact hole CH3a, it is possible to reduce a probability of occurrence of a short defect. This condition is useful when anisotropic etching is employed.

Meanwhile, the present invention is applicable even to the first contact hole, the second contact hole, and the third contact hole, and description thereof is provided briefly.

Fourth Embodiment

Figure 15:
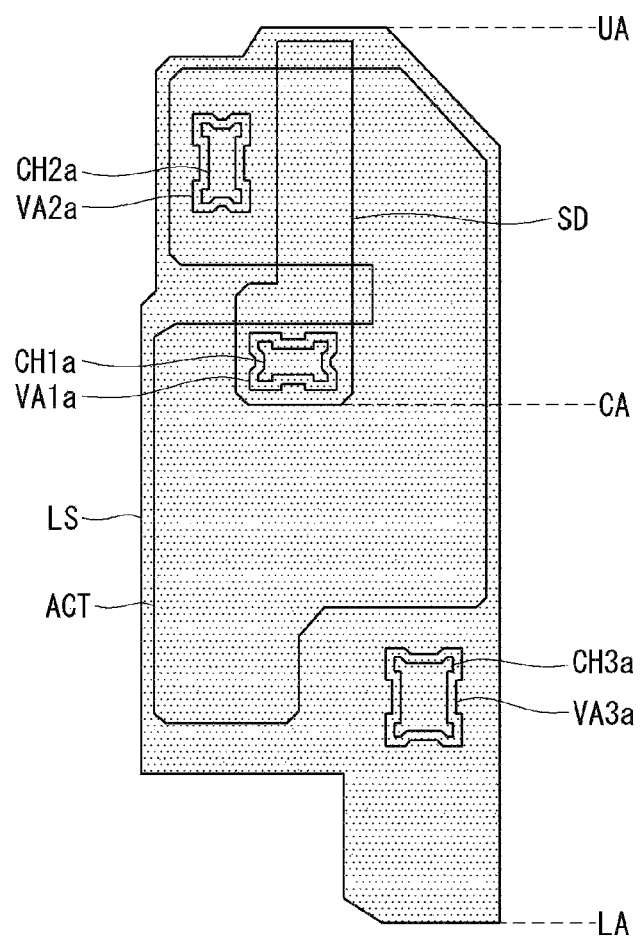
FIG. 15 is a top view showing details of first to third contact holes and first to third auxiliary contact holes according to a fourth embodiment of the present invention.

FIG. 15 is a top view showing details of first to third contact holes and first to third auxiliary contact holes according to a fourth embodiment of the present invention.

As described with reference to the first to third embodiments, devices formed in a circuit area are formed during a process of depositing multiple metal layers and multiple insulating layers. Thus, if the first to third auxiliary contact holes are formed in areas corresponding to the first to third contact holes in which multiple metal layers and multiple insulating layers are positioned, it is possible to further reduce a probability of occurrence of an unintended short defect between multiple layers positioned on different layers.

As described above, in the case where an auxiliary contact hole structure is used, it is possible to dramatically reduce a probability of an unintended short defect between different metal layers upon electrical contact within an area where multiple metal layers and multiple insulating layers exist. In addition, if an auxiliary contact hole structure is used as in the present invention, it is not necessary to come up with the design to avoid an area having a high probability of occurrence of a short defect. Therefore, reduction in an aperture ration due to use of additional area in the avoidance design may help to prevent a problem that lifetime of a device is reduced (e.g., reducing an area occupied by a capacitor), thereby improving performance of the device.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a light shield layer disposed on a first substrate;
   a buffer layer disposed on the light shield layer;
   a semiconductor layer disposed on the buffer layer;
   a first insulating layer disposed on the semiconductor layer;
   a gate metal layer disposed on the first insulating layer;
   a second insulating layer having a contact hole disposed on the gate metal layer and exposing a portion of the gate metal layer; and
   a source drain metal layer disposed on the second insulating layer and in contact with the gate metal layer through the contact hole,
   wherein the semiconductor layer comprises an auxiliary contact hole located in an area corresponding to the contact hole.

2. The display device of claim 1, wherein size of the auxiliary contact hole is equal to or larger than size of the contact hole.

3. The display device of claim 1, wherein the contact hole and the auxiliary contact hole is disposed on at least one of a central portion, an upper portion, and a lower portion of a circuit area defined in a subpixel.

4. A display device, comprising:
a light shield layer disposed on a first substrate;
a buffer layer disposed on the light shield layer;
a semiconductor layer disposed on the buffer layer;
a first insulating layer disposed on the semiconductor layer;
a gate metal layer disposed on the first insulating layer;
a second insulating layer disposed having a contact hole on the semiconductor layer and exposing a portion of the semiconductor layer; and
a source drain metal layer disposed on the second insulating layer and contacting the semiconductor layer through the contact hole,
wherein the light shield layer comprises an auxiliary contact hole located in an area corresponding to the contact hole.

5. The display device of claim 4, wherein size of the auxiliary hole is equal to or larger than size of the contact hole.

6. The display device of claim 4, wherein the contact hole and the auxiliary contact hole is disposed on at least one of a central portion, an upper portion, and a lower portion of a circuit area defined in a subpixel.

7. A display device, comprising:
subpixels each disposed on a first substrate and having an emitting area and a circuit area,
wherein each of the subpixels comprises:
a contact hole formed in the circuit area and exposing a portion of a lower layer to help electrical connection between a signal line and a power line; and
an auxiliary contact hole provided below the contact hole and located in an area corresponding to the contact hole, and
wherein the auxiliary contact hole is provided on a conducting layer that is three layers lower than the contact hole.

8. The display device of claim 7, wherein the conducting layer comprises a light shield layer disposed on the first substrate or a semiconductor layer disposed on the light shield layer.

9. The display device of claim 7, wherein the contact hole and the auxiliary contact hole are disposed in an outer area of the conducting layer.

* * * * *